United States Patent [19]
Satoh

[11] Patent Number: 6,093,648
[45] Date of Patent: Jul. 25, 2000

[54] PRODUCTION METHOD FOR A DISCRETE STRUCTURE SUBSTRATE

[75] Inventor: Tsutomu Satoh, Niigata-ken, Japan

[73] Assignee: Naoetsu Electronics Company, Niigata-ken, Japan

[21] Appl. No.: 09/114,074

[22] Filed: Jul. 13, 1998

[30] Foreign Application Priority Data

Mar. 26, 1998 [JP] Japan ................... 10-078903

[51] Int. Cl.[7] .................................. H01L 21/302
[52] U.S. Cl. ................ 438/690; 438/918; 438/923; 438/977
[58] Field of Search .................... 438/690, 460, 438/918, 560, 923, 959, 974, 977

[56] References Cited

U.S. PATENT DOCUMENTS

| | | | |
|---|---|---|---|
| 4,514,748 | 4/1985 | Beab et al. | 357/58 |
| 5,114,876 | 5/1992 | Weiner | 437/89 |
| 5,472,909 | 12/1995 | Akatsuka et al. | 437/160 |
| 5,933,751 | 8/1999 | Hirota | 438/558 |

FOREIGN PATENT DOCUMENTS

| | | |
|---|---|---|
| 823308 | 2/1998 | European Pat. Off. . |
| 3-283532 | 12/1991 | Japan . |
| 8-097164 | 4/1996 | Japan . |

OTHER PUBLICATIONS

Patent Abstracts of JP 8–097164, vol. 096, No. 008, Aug. 30, 1996.

Patent Abstracts of JP 3–283532, vol. 016, No. 108, Mar. 17, 1992.

*Primary Examiner*—Benjamin L. Utech
*Assistant Examiner*—Kin-Chan Chen
*Attorney, Agent, or Firm*—Greenblum & Bernstein P.L.C.

[57] ABSTRACT

The problem to be solved by the present invention is providing a production method capable of adjusting a dislocation density freely to a required dislocation density level for a discrete structure substrate. According to the present invention, when producing a discrete structure substrate generally said to have a low level dislocation density in which an average dislocation density is 5000 pieces/cm$^2$, diffusing a wafer after determining its thickness so as to meet required dislocation density level, a wafer thickness is adjusted within a specified range before diffusion is carried out.

2 Claims, 1 Drawing Sheet

PRODUCTION METHOD FOR A DISCRETE STRUCTURE SUBSTRATE

BACKGROUND OF THE INVENTION

1. Field of the Invention

This invention relates to a production method for a discrete structure substrate of a silicone semiconductor wafer having two-layer structure in which one side thereof is a diffusion layer and the other side is a non-diffusion layer. More specifically this invention relates to a production method for a discrete structure substrate requiring an excellent crystallinity in which a dislocation density measurable on the surface of the non-diffusion layer is less than 5000 pieces/cm$^2$ on average, for use in transistors, diodes and the like. Further this invention specifically relates to a production method for a discrete structure substrate, in which diffusion is carried out under a raw material wafer thickness adjusted and determined by a dislocation density required when a discrete structure substrate is formed, so as to control an occurrence of a dislocation in the non-diffusion layer which may occur during the diffusion and the required dislocation density is satisfied finally when a discrete structure is manufactured to a predetermined dimension.

2. Description of the Prior Art

Conventional Method (1)

A conventional production method for a discrete structure substrate comprises the steps of:

preparing a raw material wafer subjected to a predetermined pretreatment;

forming a diffusion layer having a predetermined depth from both sides of the wafer by diffusion method; and removing the diffusion layer on one side of the wafer.

After that, a discrete structure substrate having a predetermined diffusion layer thickness (Xj) and a non-diffusion layer thickness (Xi) is produced.

Therefore, the raw material wafer thickness is product thickness (Xj+Xi) plus a minimum mechanical processing thickness including removal of the diffusion layer on one side.

Conventional Method (2)

Because, according to the above conventional method, one of the diffusion layers formed on both sides of the wafer is removed so that consequently half of the diffusion layers is wasted, recently a following method has been used. This method comprises the steps of:

preparing a raw material wafer subjected to a predetermined pretreatment;

forming diffusion layer having a predetermined depth from both sides of the wafer by diffusion method; and cutting the wafer along the center in the wafer thickness direction.

According to this method, finally two pieces of the discrete structure substrates having a predetermined diffusion layer thickness (Xj) and non-diffusion layer thickness (Xi) are produced.

Therefore, the raw material wafer thickness is twofold of the product thickness (Xj+Xi) plus cutting thickness and minimum mechanical processing thickness on each cutting face.

This method does not look to lead to reduction of raw material because a thick wafer is used although two pieces of the discrete structure substrate can be obtained. However, for the reduction of the raw material, a loss thereof caused when a wafer is cut from an ingot must be additionally considered and so this method ensures the reduction of the raw material.

The conventional methods (1), (2) have been described. In any case, the raw material wafer thickness before diffusion is product thickness (thickness of a discrete structure substrate) plus minimum mechanical processing thickness (consequently, cutting dust) for obtaining a predetermined product dimension.

SUMMARY OF THE INVENTION

Of the production methods of the discrete structure substrate, this invention concerns a diffusion method. When a discrete structure substrate is produced by this diffusion method, heat treatment on the wafer under a high temperature (e.g., more than 1280° C.) for a long time (e.g., 165 hours) is indispensable to obtain a predetermined impurity "density" and "a diffusion layer depth".

Upon heat treatment,

[1] The atom radius of phosphorus and boron which are typical impurities of N type and P type for forming the diffusion layer is smaller than that of silicone. As a result, they are substituted by Si atoms so that a shrinkage force generated in the diffusion layer and generates a stress in the non-diffusion layer as well.

[2] Because of such a special condition in which wafers are in contact with each other when they are taken into or from a diffusion furnace, particularly in a wafer having a thickness larger than a some thickness (for example 1300 $\mu$), a difference of temperature between the outer periphery and center portion of the wafer expands so that a thermal stress occurs in the non-diffusion layer.

Mainly due to the above reasons, a dislocation or continuous dislocation called slip necessarily occurs in the non-diffusion layer of the wafer.

This dislocation is generally said to be a factor for deteriorating "electric characteristic when finally a device is completed". Therefore there is a serious problem that a target characteristic cannot be obtained. On the other hand, there is a special case that, for such a reason that high frequency characteristic can be improved by an existence of a dislocation of some level distributed equally, the dislocation density of a certain range may be required.

Accordingly, an object of the present invention is to provide a production method capable of adjusting the dislocation density freely to a required dislocation density level for a discrete structure substrate in which the average dislocation density measurable on the non-diffusion layer surface of the discrete structure substrate is from 5000 pieces/cm$^2$ to zero (near non defect crystal).

The present invention relates to a production method for a discrete structure substrate of a silicone semiconductor wafer having two-layer structure in which one side thereof is a diffusion layer (Xj) and the other side thereof is a non-diffusion layer (Xi) and a dislocation density of the surface of the non-diffusion layer is less than 5000 pieces/cm$^2$ on average, the production method comprising: lapping a silicone semiconductor wafer, a raw material wafer (a processing distortion remains) thickness (T) (unit: $\mu$m) before diffusion being expressed in following expression (1);

$$T=2Xj+Xi+\alpha \tag{1}$$

diffusing under a raw material wafer thickness in which the $\alpha$ value in the expression (1) is determined in a range of $45 \leq \alpha \leq 930$ so as to satisfy a dislocation density required when a discrete structure substrate is formed; and obtaining a discrete structure substrate having two-layer structure of a predetermined thickness.

Explaining more in detail, when a diffusion layer is formed using a raw material wafer pretreated in which a processing distortion caused by lapping remains, because the diffusion layer is formed from both sides of the wafer (formation of a single side is impossible currently), at least a thickness of (2Xj+Xi) is needed for obtaining a single discrete structure substrate and the raw material wafer thickness (T) is expressed as follows;

$$T=2Xj+Xi+\alpha \quad (1)$$

The $\alpha$ is an adjusting factor for determining the raw material wafer thickness. This $\alpha$ is determined in a range of $45 \leq \alpha \leq 930$ depending on a dislocation density required on the surface of a non-diffusion layer when a discrete structure substrate is formed. Diffusion is carried out in a raw material wafer having the thickness and finally a discrete structure substrate having a predetermined thickness is formed.

The range of the adjusting factor $\alpha$ has a lower limit value, at least 45 $\mu$m is necessary to get low level dislocation density. As the value $\alpha$ is increased, the dislocation decreases although there is a difference of the degree of the dislocation depth. If a certain limit is exceeded, a problem of an occurrence of a slip clearly occurs, and therefore 930 $\mu$m is a upper limit value.

The above-mentioned relation will be easy to understand referencing to FIG. 1 showing a relation between the value of $\alpha$ and a dislocation, which occurs in the process of diffusion (during heat loading) and is measurable on the surface of the non-diffusion layer. When the diffusion layer thickness is Xj, the non-diffusion layer thickness is Xi and a thickness of a part of the central non-diffusion layer is $\alpha$ (as shown in FIG. 2, indicating a section of a wafer after the diffusion is completed), FIG. 1 shows changes of the dislocation density on the surface of the non-diffusion layer when the $\alpha$ value is changed. Concerning to an occurrence of dislocation, the most important factor under the same diffusion condition (FZ, N type, and <111>) is Xj, which is used as a parameter.

Conceptual levels "shallow", "medium" and "deep" of the Xj (diffusion depth) are classified such that the shallow level is (Xj<120 $\mu$m), the medium level is (120 $\mu$m $\leq$ Xj<250) and the deep level is (Xj$\geq$250 $\mu$m) and as each typical example, three examples, curve ① (80 $\mu$m), curve ② (170 $\mu$m), curve ③ (300 $\mu$m) are shown here.

It is apparent that by increasing this $\alpha$ value (increasing the raw material wafer thickness) as the diffusion depth increases, the dislocation density extremely decreases.

In accordance with the present invention, the occurrence of the dislocation as shown by curve ① (80 $\mu$m) is the case of above shallow level, therefore even if the wafer thickness is increased, its effect is still low.

But in the case of medium or deep level, the dislocation density decreases more and more as wafer thickness is increasing.

Therefore, there is applied a production method for a discrete structure substrate according to the present invention wherein the $\alpha$ value in the expression (1) is determined in a range of $330 \leq \alpha \leq 930$ when the value of the above diffusion layer (Xj) is 120 $\mu$m $\leq$ Xj $\leq$ 400 $\mu$m and the non-diffusion layer (Xi) is Xi$\geq$20 $\mu$m.

The present invention further relates to a production method for a discrete structure substrate wherein the $\alpha$ value in the expression (1) is determined in a range of $45 \leq \alpha \leq 780$ when the value of the above diffusion layer (Xj) is Xj<120 $\mu$m and the non-diffusion layer (Xi) is Xi$\geq$30 $\mu$m.

The present invention further relates to a production method for a discrete structure substrate wherein a finishing method for the non-diffusion layer surface is surface grinding and grinding stone number is #1500 to #3000.

A relation between the grinding stone number and average diameter d (unit: mm) of grain follow an expression below.

$$d=(25.4/\text{indication number})\times 0.58$$

Thus, the average grain diameter of grinding stone for ordinary use such as diamond is 5.9 $\mu$m–9.8 $\mu$m.

As for an operation of the present invention, when a wafer having a predetermined thickness is subjected to diffusion, the raw material wafer is lapped so that a dislocation which may occur in the diffusion process is suppressed by a remaining processing distortion. The thickness of the raw material wafer is determined on the condition that the $\alpha$ value in the expression (1) is $45 \leq \alpha \leq 930$, that is, $\alpha$ is more than 45 $\mu$m and less than 930 $\mu$m. Here, the upper and lower limit values of the $\alpha$ value will be described according to FIGS. 1, 2.

As for the lower limit value, if the a value is assumed to be zero in FIG. 2 and the lower side Xj layer is removed and then a discrete structure substrate having a thickness of Xj+Xi is produced, the face from which Xj is removed becomes the non-diffusion layer surface of a product. Because that surface is strongly affected by a stress of the Xj layer to be removed before the discrete structure substrate is formed, the dislocation increases rapidly.

To avoid such a phenomenon, it has been found that the $\alpha$ value is more than 45 $\mu$m. Thus, this value is applied as its lower limit value and by applying a value more than that lower limit value, it is possible to avoid an influence of the stress of the diffusion layer to be removed.

As for the upper limit value, because generally the diffusion layer required for the discrete structure substrate is deep so that a high temperature, long hour treatment is required, if production cost is considered, it is desired that a number of pieces per single batch charged in a diffusion furnace is as large as possible. As for the charging style, a plurality of wafers are charged at the same time in a special condition in which they are fit to each other via buffering agent (preventing fixing), therefore there is little heat conduction due to convection. (usually, when plural groups of the wafers are taken in or out of the diffusion furnace and treated, they are placed in a predetermined interval so that gap may exist.)

Then, a difference of temperature between the center portion and outer periphery of the wafer increases so that a thermal stress occurs. As a result, another type of dislocation continuous linearly (slip) is more likely to occur as the thickness of the raw material wafer increases. It has been found that the slip increases rapidly if the raw material wafer thickness exceeds about 1400 $\mu$m. By using a value below the upper limit value, it is possible to prevent an occurrence of the slip which deteriorates the characteristic of a completed device.

This phenomenon is indicated by the curve ④ in FIG. 1. Because the slip is concentrated on a part and difficult to express numerically, the slip is expressed by only "strong" and "weak".

The above description is the reason that the $\alpha$ value is in a certain range, and by adjusting the $\alpha$ value in this range, a required dislocation density of the discrete structure substrate can be satisfied.

Further in accordance with the present invention, the value of the aforementioned diffusion layer (Xj) is 120 $\mu$m $\leq$ Xj $\leq$ 400 $\mu$m and the value of the non-diffusion layer (Xi) is Xi$\geq$20 $\mu$m. This is often the case of a discrete structure substrate of ordinary transistor. If the diffusion layer is formed so as to be thicker, naturally the dislocation is increased, however by increasing the α value, a required dislocation density can be satisfied. Such a thickwafer is advantageous in terms of cost if it is divided to two pieces by cutting along the center line in the thickness direction. If the α value is more than 330 μm, a preferable cutting method can be selected thereby achieving a reduction of cost, so that a required dislocation density can be satisfied.

Further in accordance with the present invention, the value of the diffusion layer is Xj<120 μm and the value of the non-diffusion layer is Xi≧30 μm. If the diffusion layer is formed thin, the dislocation is not likely to occur, so that the α value does not have to be set large. By setting the α value so as to be less than 780 μm, the raw material can be reduced and a required dislocation density can be satisfied.

Further in accordance with the present invention, usually the surface of the non-diffusion layer of the discrete structure substrate is mirror surface. In the case in which the diffusion layer is shallow, opposite conductive impurity is diffused from the mirror side of the non-diffusion layer so that a completed product is often used as diode. From the standpoint of the characteristic of the device, the surface does not always have to be a mirror surface created by polishing, and it has been found that surface grinding using grinding stone number #1500–#3000 is capable of satisfying its characteristic sufficiently. Thus, it is possible to terminate processing with surface grinding. (it is possible to omit polishing which is a high load process, thereby reducing production cost).

The composition described in the present invention of the production method for the discrete structure substrate according to the present invention aims at a discrete structure substrate in which a relatively low level dislocation density (less than 5000 pieces/cm² on average) is required. By adjusting the raw material wafer thickness before diffusion so as to correspond to a target dislocation level, it is possible to achieve a level near the non-defect crystal which could not be achieved in prior art, so that finally when it is transformed to a device, its required performance can be exerted fully.

DESCRIPTION OF THE PREFERRED EMBODIMENTS

Figure 1:
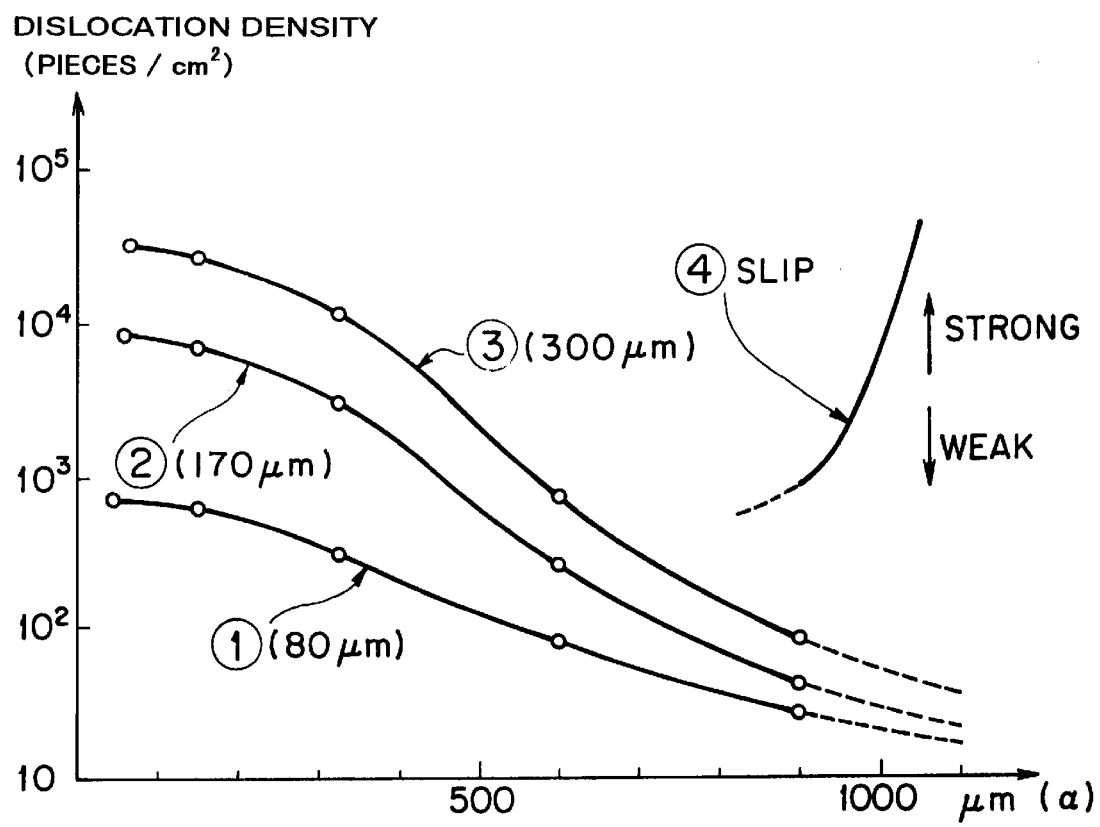
FIG. 1 is a conceptual diagram showing a relation between a value (concerning to a raw material wafer thickness before diffusion) and a dislocation density caused at that time.
Figure 2:
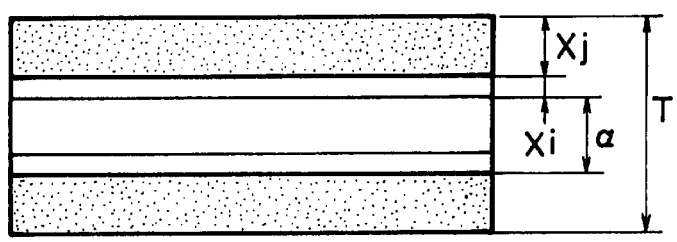
FIG. 2 is a sectional view of a wafer after the diffusion is terminated.

Hereinafter, the embodiment of the production method for the discrete structure substrate according to the present invention will be described.

[Embodiment 1]

This is an embodiment for a wafer of 100Ø (see Table 1) in typical diameter for the discrete substrate. The product specification is FZ, N type, <111>, 30–40 Ω·cm, Xj=170 μm, Xi=50 μm, non slip. The dislocation density is 100 pieces/cm²–300 pieces/cm².

The raw material wafer (before diffusion) is a wafer subjected to surface finishing, that is, lapping having a processing distortion said to suppress an occurrence of the dislocation and the free grain for use is FO (product name) #1000, #1200 and the like. Although processing distortion depends on operation condition, it is said that the distortion is 3–4 μm. Thus, etching for removing heavy metal or the like is limited to 2 μm or less on a one side surface and the processing distortion is kept as it remains. In the embodiments 2 and 3 described below, the processing distortion is kept also.

Corresponding to the standard of a required dislocation density, the α value of the embodiment 1 is determined according to a previous achievement data (α=600 μm) and its result is satisfactory. For reference, a upper limit value (α=930 μm) and a lower limit value (α=330 μm) of the α value are set so as to provide references a and b, which are described in Table 1 as a comparative example.

In the embodiment, only by increasing the raw material thickness by 270 μm as compared to the reference (a), the dislocation is decreased remarkably so that a required dislocation density [100 pieces/cm²–300 pieces/cm²] may be satisfied.

The reference (b) is a case in which the raw material thickness is increased so as to be 330 μm larger than the embodiment. Little dislocation is observed under a microscope (the dislocation density is almost zero) and this is applied only when Xi layer which is near a perfect crystal is required.

Meanwhile, in the case of special specification which cannot be estimated because of previous achievement results or the like, α value should be confirmed preliminarily. (Because of the α value is influenced by Xj (diffusion depth), and slightly influenced by ingot production method (FZ method or CZ method), diameter, resistivity, conductive type (N type or P type) and the like.)

[Embodiment 2]

This is an embodiment in which the diameter of the discrete piece substrate is 125Ø (see Table 1). The product specification is FZ, N type, <111>, 50–65 Ω·cm, Xj=180 μm, Xi=70 μm, non slip and the dislocation density of 1000 pieces/cm²±20% is required.

Like the previous embodiment, the raw material wafer (before diffusion) is subjected to surface finishing having a processing distortion said to suppress an occurrence of the dislocation. The surface is etched (less than 2 μm totaling both sides) not so as to eliminate the processing distortion.

Like the embodiment 1, an upper limit value (α=930 μm) and a lower limit value (α=330 μm) of the α value are determined so as to provide references a and b. A result of the dislocation density of the references a and b is shown in Table 1.

In the embodiment, only by increasing the raw material wafer thickness by 250 μm as compared to the reference (a), the dislocation is reduced remarkably so that the required dislocation density of 1000 pieces/cm²±20% is satisfied. The example (b) is a case in which the raw material wafer thickness is increased so as to be 350 μm larger than the embodiment. Little dislocation is observed under a microscope (dislocation density is almost zero) and this embodiment is applied only when the Xi layer which is near perfect crystal is required.

TABLE 1

|  | Embodiment 1 (required dislocation density: 100–300 pieces/cm²) | | | Embodiment 2 (required dislocation density: 1000 pieces/ cm² ± 20%) | | |
| --- | --- | --- | --- | --- | --- | --- |
| α value (μm) (Raw material wafer thickness) | 330 (720) | 600 (990) | 930 (1320) | 330 (760) | 580 (1010) | 930 (1360) |
| Measured dislocation density | 3814 | 192 | (Not found) | 10027 | 1023 | (Not found) |

TABLE 1-continued

| | Embodiment 1 (required dislocation density: 100–300 pieces/cm²) | | | Embodiment 2 (required dislocation density: 1000 pieces/ cm² ± 20%) | | |
|---|---|---|---|---|---|---|
| (pieces/cm²) Average of four peripheral points (5 mm) and a central point Carried out or for reference | (reference a) | Carried out | (reference b) | (reference a) | Carried out | (reference b) |
| Product specification | | | | | | |
| Crystal | Fz · N type · <111> | | | Fz · N type · <111> | | |
| Diameter (mm) | 100 | | | 125 | | |
| Resistivity Ω · cm) | 30~40 | | | 50~65 | | |
| Xj (μm) | 170 | | | 180 | | |
| Xi (μm) | 50 | | | 70 | | |
| Impurity | phosphorus | | | phosphorus | | |
| Diffusion condition | Specified | | | Specified | | |
| Machining condition | Specified | | | Specified | | |

*Dislocation density: Obtained by etching Xi layer surface, counting triangular pits (dislocation) under a microscope and then converting to a value per 1 cm².

As evident from [Embodiment 1] and [Embodiment 2], the raw material wafer thickness is determined depending on the dislocation density measured on a non-diffusion layer surface after terminating the diffusion process, it is possible to carry out very effective dislocation control. After that a suitable processing method is to divide to two pieces by cutting the central line in the thickness direction and this is a reasonable method in terms of production cost.

[Embodiment 3]

This is an embodiment in which the diameter of the discrete piece substrate is 100Ø. The product specification is FZ, N type, <111>, 29–41 Ω·cm, Xj=55 μm, Xi=185 μm, non slip and the dislocation density of less than 200 pieces/cm² is required.

Like the previous embodiment, the raw material wafer (before diffusion) is subjected to surface finishing having a processing distortion said to suppress an occurrence of the dislocation. The surface is etched (less than 2 μm totaling both sides) not so as to eliminate the processing distortion.

In a case in which such a shallow diffusion layer is formed, if the α value is more than 45 μm, it can be confirmed that the dislocation density is less than 100 pieces/cm² irrespective of the α value. So, there is no quality merit when the α value is increased or no cost merit by applying the method of cutting along the center line in the wafer thickness direction after the diffusion is terminated, and therefore such a measure is not taken.

Thus, the raw material wafer thickness is 340 μm when α=45 μm minimum, and after the diffusion is terminated, the wafer one side is subjected to primary and secondary surfaces grinding in 100 μm (diffusion layer thickness +45 μm). The secondary surface grinding is finished by #2000 grinding stone so as to produce a discrete structure substrate having a thickness of 240 μm.

The aforementioned [embodiment 1], [embodiment 2], [embodiment 3] aim at wafer having crystal axis of <111> and the wafer of crystal axis <100> is substantially the same. The dislocation density is measured by etching the surface of the wafer. Although in the wafer of crystal axis <111>, clear triangular pits caused by the etching treatment can be measured, the clear dents are difficult to appear on a wafer of crystal axis <100>, and therefore it is necessary to devise the composition of the etching solution.

Having described specific preferred embodiments of the invention with reference to the accompanying drawings, it will be appreciated that the present invention is not limited to those precise embodiments, and that various changes and modifications can be effected therein by one of ordinary skill in the art without departing from the scope of the invention as defined by the appended claims.

What is claimed is:

1. A diffusion method in the production of a double-structure discrete substrate comprising a diffused layer having a thickness (Xj) on one side and a non-diffused layer having a thickness (Xi) on the other side and further having an average surface dislocation density of less than 5000 pieces/cm² on the surface of the non-diffused layer, obtained by lapping a silicon semiconductor wafer, wherein the method comprises:

forming a diffused layer on both sides of a raw material wafer wherein processing distortions remain, removing the diffused layer on one side of the wafer or slicing the wafer into two pieces, each having a diffused layer and a non-diffused layer, characterized in that the raw material wafer thickness (T in μm) before the diffusion is represented by the following formula:

T=2Xj+Xi+α, wherein α is an adjusting factor for determining the wafer thickness before processing and is a value in the range of 45 μm≦α≦930 μm, and adjusting the thickness of the raw material wafer before the diffusion so as to satisfy a dislocation density required on the non-diffused layer surface when the discrete substrate is finally produced.

2. The diffusion method as claimed in claim 1, wherein the value of the diffused layer (Xj) is in the range of 120 μm≦α≦400 μm, the value of the non-diffused layer (Xi) is Xi≧20 μm and the α value is in the range of 330 μm≦α≦930 μm when the discrete substrate is produced by slicing the wafer having diffused layers formed thereon into two pieces.

* * * * *